United States Patent [19]

Authier et al.

[11] 4,141,764
[45] Feb. 27, 1979

[54] PROCESS FOR THE MANUFACTURE OF SILICON OF LARGE SURFACE AREA BONDED TO A SUBSTRATE AND SILICON-BONDED SUBSTRATES SO MADE

[75] Inventors: Bernhard Authier; Heinz J. Rath; Dietrich Schmidt, all of Burghausen; Johann Hofer, Kirchdorf, all of Fed. Rep. of Germany

[73] Assignee: Wacker Chemitronic Gesellschaft fur Elektronik-Grundstroffe mbH, Burghausen, Fed. Rep. of Germany

[21] Appl. No.: 840,708

[22] Filed: Oct. 11, 1977

[30] Foreign Application Priority Data

Nov. 16, 1976 [DE] Fed. Rep. of Germany ....... 2652218

[51] Int. Cl.² ................... H01L 21/223; H01L 21/383
[52] U.S. Cl. ..................................... 148/174; 148/175; 427/51; 427/74; 427/85; 427/86
[58] Field of Search ............... 427/51, 74, 85, 86, 427/113, 248 R, 374 CE, 398 R, 398 C, 398 D; 148/174, 175; 136/89 CC; 156/606, 616 R

[56] References Cited

U.S. PATENT DOCUMENTS

| 3,141,849 | 7/1964 | Enk | 156/60 S |
|---|---|---|---|
| 3,335,038 | 8/1967 | Doo | 156/621 |
| 3,808,033 | 4/1974 | Mayhew | 427/398 C |
| 3,900,943 | 8/1975 | Sirtl | 136/89 TF |
| 4,059,461 | 11/1977 | Fan | 427/86 |

OTHER PUBLICATIONS

Chu et al., IEEE Photospecialist Conf. (May 6, 1975), pp. 303–305.
Chu et al., IEEE Trans. on Electron Devices, vol. ED-24, No. 4, 4–1977, pp. 442–446.
Chu et al., J. Electrochem. Soc., vol. 122 (No. 12), pp. 1681–1685, 12–1975.
Chu et al., J. Electrochem. Soc., vol. 123, No. 1, pp. 106–110, (1–1976).

*Primary Examiner*—Michael F. Esposito
*Attorney, Agent, or Firm*—Allison C. Collard; Thomas M. Galgano

[57] ABSTRACT

Process for the manufacture of silicon of large surface area bonded to a substrate, which comprises depositing silicon to a thickness of from 30 to 500 μm onto panel-shaped substrates of glassy carbon (a glass-like carbon obtained by carbonizing a spatially cross-linked synthetic resin) that are heated by direct passage of an electric current to temperatures above the melting point of silicon, and thereafter cooling the silicon to a temperature below its melting point in the direction from its free surface toward the substrate. The invention also comprises the silicon panels so made which are especially useful in the manufacture of solar cells.

5 Claims, 3 Drawing Figures

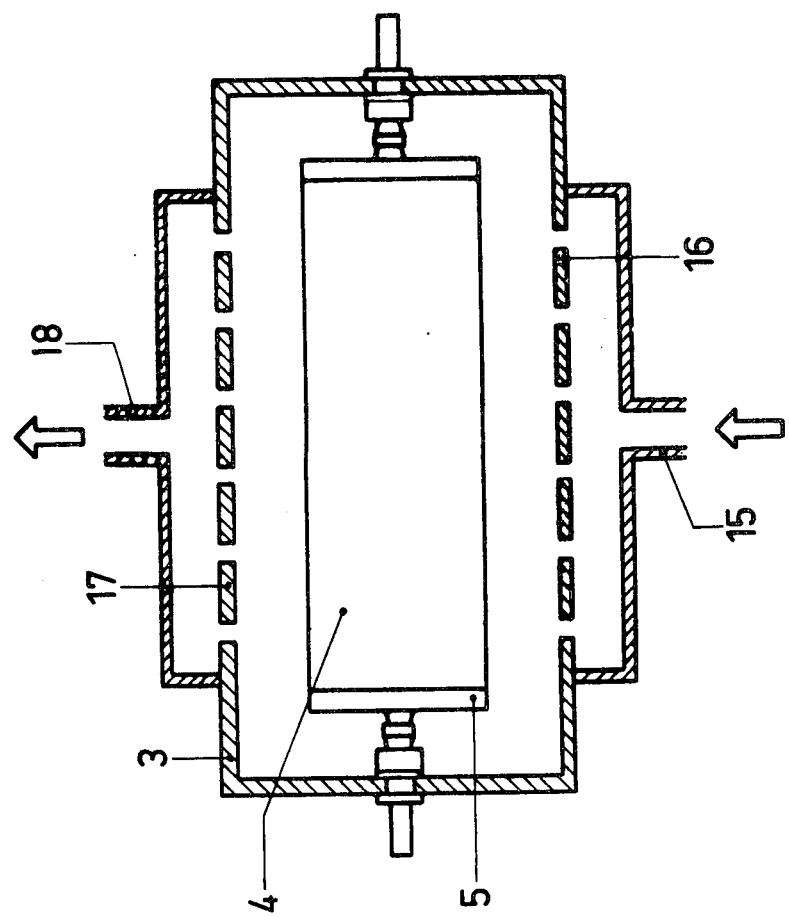

PROCESS FOR THE MANUFACTURE OF SILICON OF LARGE SURFACE AREA BONDED TO A SUBSTRATE AND SILICON-BONDED SUBSTRATES SO MADE

The subject of the invention is a process for the manufacture of silicon of large surface area bonded to a substrate by deposition from the gaseous phase onto panel-shaped substrates, wherein the silicon deposited is converted from its molten state into a crystalline form under the influence of a temperature gradient at a right angle to the surface of the substrate.

In space travel, where solar cells are used as current generators, silicon is used in monocrystalline form only, because of its high efficiency. However, this material is much too expensive for terrestrial use, since about 70% are lost alone in processing, especially in the sawing of monocrystalline rods.

Although solar cells manufactured from polycrystalline silicon are much cheaper, they are usually considerably less efficient. Solar cells have been manufactured, for example, by T. L. Chu et al, by depositing silicon from gaseous compounds onto graphite wafers in an epireactor. The setting of high substrate temperatures, low deposition rates, and the composition of the deposition gas determine, to a large extent, the efficiency of the solar cells produced therefrom, the efficiency of the solar cells being 5% at the most, even after a special heat treatment of the deposited silicon layer (*Journal of Electrochem. Soc.* 1976, pages 106 to 110).

In accordance with the process described in German Offenlegungsschrift No. 26 04 351, a strip of carbon substrate is moved in longitudinal direction past a silicon supply melt and is brought into contact with the melt for a short time, so that a liquid silicon layer is drawn onto the solid substrate, which solidifies to form a coarsely crystalline silicon layer as the strip is continuously passed on and thereby removed from the hot silicon supply melt. According to the teaching of that application, the resulting laminar body is supported to be suitable for the manufacture of solar cells. However, that process too, is extremely expensive since the silicon supply melt is produced by gradually melting a polycrystalline rod of silicon manufactured according to known processes by means of an induction heating coil.

Finally, German Offenlegungsschrift No. 25 08 803 describes a process according to which silicon is directly cast into thin plates under the influence of a temperature gradient. Solar cells having efficiencies far greater than 5% can be produced from this material, which has larger monocrystalline areas with the preferred crystallographic orientation.

It is the object of the present invention to provide a process, which is simpler and therefore more economical than the known processes, for the manufacture of silicon layers of large surface area which may be processed, in particular, to form solar cells of high efficiency.

This task is accomplished by depositing to a thickness of from 30 to 500 μm onto panel-shaped substrates of glassy carbon that are heated by the direct passage of an electric current to a temperature above the melting point of silicon, whereupon the silicon is cooled to a temperature below its melting point in the direction from its free surface towards the substrate.

According to the invention, appropriately shaped bodies of glassy carbon are used as panel-shaped substrates. Glassy carbon is a glass-like carbon manufactured by carbonizing a spatially cross-linked synthetic resin.

The manufacture of these bodies from glassy carbon is effected, for example, by converting substances such as, for instance, polyester resins, polyfurfuryl alcohols or acetylenic polymers by a conventional method, for instance, by simple heat deformation, into the shaped body required in each case. This shaped body, for example, a board of a size to correspond with the particular requirements, is subsequently converted by a high-temperature treatment at temperatures in the range of from 1,000 to 3,000° C. in an inert gas atmosphere of, for example, hydrogen or argon, into a correspondingly shaped body of glassy carbon. Such bodies of glassy carbon do not have any open pores, have a high surface quality, may be easily polished, may be manufactured in high purity and, exhibit, in addition to a high degree of hardness and strength, low anisotropy and excellent resistance to changes in temperature.

In order to deposit the silicon layer, the substrate is heated by direct passage of an electric current to a temperature above the melting point of silicon, preferably to 1,430° to 1,500° C.

As deposition gas, there may generally be used, for example, silicon hydride, monochlorosilane, dichlorosilane, trichlorosilane, tetrachlorosilane, hexachlorodisilane, alone or in mixture, if desired with the addition of hydrogen or inert gases, such as, for example, argon or helium. Trichlorosilane in admixture with hydrogen is the preferred deposition gas, the hydrogen being added, for example, by passing it through liquid trichlorosilane during which it becomes charged with trichlorosilane. A separate introduction or pre-mixing of the two components in their gaseous state and in the proportion desired is, of course, likewise possible.

Preferably, dopants are added to the deposition gas during the deposition, these dopants being for example, phosphorus, arsenic or antimony, which cause an n-type conductance, but when the final product is intended for use as a solar cell, aluminum, gallium, indium or preferably boron compounds are normally suitable, and these cause a p-type conductance.

The deposition is terminated, by interrupting the flow into the reactor of components containing silicon, when the layer of the liquid silicon film on the substrate has reached the particular depth desired of about 30 to 500 μm, preferably 100 to 250 μm.

The free surface of the silicon film is then cooled by suitable means, preferably by passing a cooling gas over it, for example, hydrogen or argon at room temperature, and by reducing the supply of electric current to the substrate at the same time, in order to obtain an oriented solidification of the silicon film from the free surface towards the substrate. By adjusting the amount of cooling gas flowing past and by controlling the electric current flowing through the substrate, the degree of the temperature gradient can be controlled as desired. When the silicon has solidified, the entire installation is finally cooled to room temperature by switching off the flow of the electric current in the substrates.

Any troublesome impurities which may be present in the silicon move from the free surface towards the substrate as they settle out during the solidification process. As a result of this, the upper part of the silicon layer is purified, which is effective for the photovoltaic effect and is exposed to the radiation of the sun. Impurities which may accumulate in the lower part of the layer are not troublesome, since this part is essentially used only for effecting ohmic contact.

The pn-transition that is necessary for the silicon of large surface area bonded to a substrate, produced according to the invention, to be used as a solar cell, can be obtained according to known processes, for example, by brushing the solidified surface of the silicon film with suitable dopant compound, and by subsequent superficial diffusion of the dopant by suitable heat treatment. However, a further possibility consists, for example, of incorporating the dopants by ion implantation into the surface region of the solid silicon layer. The dopant incorporated in this manner, for example, to a depth of up to about 0.5 to 3 $\mu$m in the surface layer must, of course, dope the silicon in the opposite sense to the dopants in the adjoining silicon layer. Thus, if the silicon layer were, for example, p-doped, then, as much phosphorus, arsenic or antimony would be incorporated into the surface layer as is required to achieve an n-type conductance of this layer.

The process of the invention has the advantage that the silicon required may be used directly from the gaseous phase. The manufacture from the gaseous phase of polycrystalline silicon which must then be re-melted for processing into solar cells according to the processes of the art described, is therefore unnecessary. Because the substrates are heated by the direct passage of an electric current, expensive additional heating elements may also be dispensed with. The efficiencies of the solar cells made of the silicon produced in accordance with the process, averaging from 6 to 10%, also ensure that their use is economic.

The process is explained by way of example with reference to the accompanying drawings in which a reactor suitable for carrying out the process is illustrated schematically.

In the drawings, wherein similar reference characters denote similar elements throughout the several views:

FIG. 3 shows the opened reactor in plan view.

Figure 1:
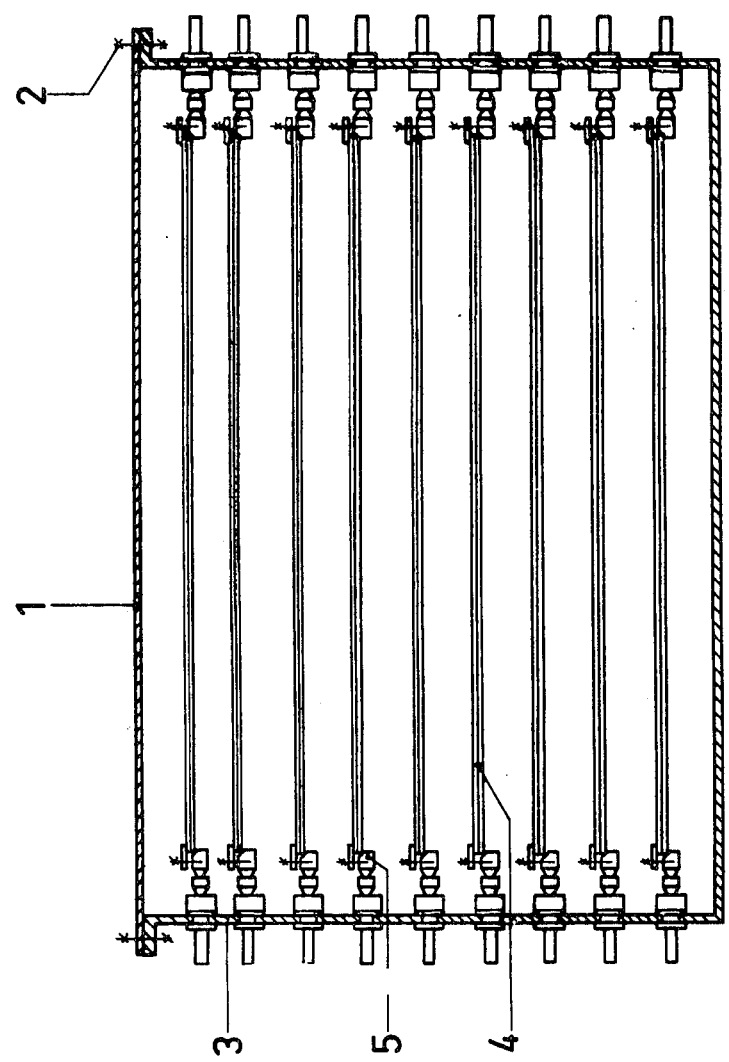
FIG. 1 shows the reactor in longitudinal cross-section.
Figure 2:
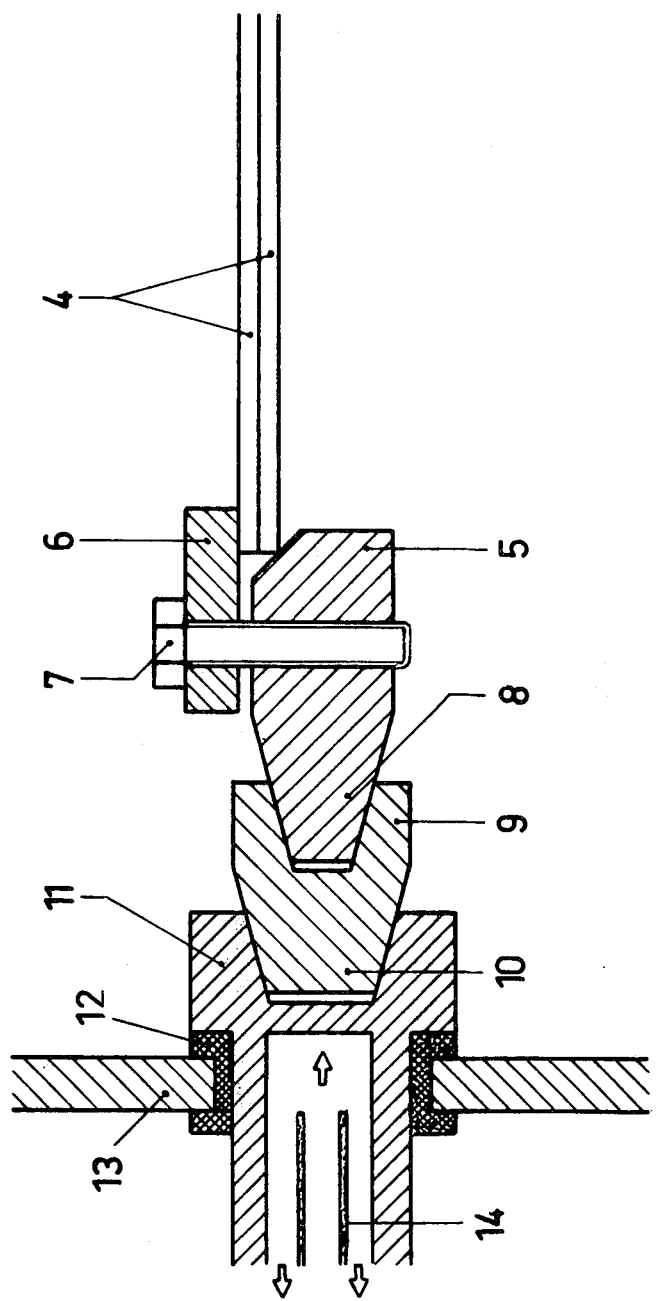
FIG. 2 shows the supply of current to and the mounting of the substrates in the reactor wall.

Referring now to FIGS. 1 and 2 of the drawings, a reactor 3 which may be sealed in a gas-tight manner, by a cover plate 1 by means of screws 2, is charged in succession from bottom to top with a plurality of glassy carbon panels 4. In each case two of these panels are positioned one on top of the other and they are fitted horizontally in pairs into carbon mountings 5 attached to two of the side walls of the reactor. The number of pairs of substrates and their size is, of course, dependent on the size of the particular reactor, the thickness of the glassy carbon panels 4, being, for example, advantageously within a range of from 1 to 4 mm.

The reactor 3 may, for example, consist of quartz glass, stainless steel, or silver-plated or nickel-plated stainless steel. The outer walls of the reactor 3 are cooled in the usual manner with air or a liquid to avoid deposits forming on the walls during the deposition process.

As seen in FIG. 2, the carbon mounting 5 is beveled at its front end so that the pair of glassy carbon panels 4 placed thereon can be firmly clamped to a carbon platelet 6 lying on top of them by screwing with a carbon screw 7. Because of the bevel at the front end of the carbon mounting 5, it is possible to adjust accurately the glassy carbon panels 4 in the reactor so that their horizontal installation in the reactor 3 is ensured.

The carbon mounting 5 is fitted with its conically tapering rear end 8, into the correspondingly shaped bush of a silver electrode head 9. The rear end 10 of the electrode head 9 is also conically tapered and is fitted into the correspondingly shaped taper of a silver-plated electrode 11. The silver-plated electrode 11 is installed in the reactor wall 13 with suitable seals 12 so that it is impervious to gas. A tube 14, made, e.g., of copper, is inserted into the interior of the hollow, silver-plated stainless steel electrode 11. During the deposition, this tube 14 is filled with a liquid cooling medium, especially water, which flows back along the tube again while subjecting the silver-plated electrode 11 to intensive cooling. This cooling ensures that the silver electrode head 9 fitted into the silver-plated stainless steel electrode 11 and also the carbon mounting 5, can be maintained at a temperature below the deposition temperature.

The advantage of placing the silver electrode head 9 between the silver-plated stainless steel electrode 11 and the carbon mounting 5 is, for example, that when the carbon mounting 5 breaks, it may easily be removed, together with the silver electrode head 9, from the system and can be repaired at the work bench again.

When the glassy carbon panels 4 have been installed, air is expelled from reactor 3 by rinsing with an inert gas, for example, argon, and the glassy carbon panels 4 are heated to temperatures of preferably 1,430° to 1,500° C. by switching on the current. The deposition gas, preferably trichlorosilane with hydrogen and an appropriate amount of dopant, for example boron-tribromide or diborane, is then introduced into the reactor 3 through the laterally disposed gas inlet tube 15, as seen in FIG. 3. Between the gas inlet tube 15 and the mounted glassy carbon panels 4 there is furthermore a gas distributor 16. The gas distributor 16 consists essentially of a metal wall extending almost over the entire side wall and having numerous holes. The position and the diameter of the individual holes are so chosen that the gas flow extends uniformly over the entire area of the reactor. On the opposite side of the reactor 3, a gas distributor 17 and a gas outlet tube 18 are arranged for the discharge of the gases.

When a silicon film of about 30 to 500 $\mu$m thickness, preferably from 100 to 250 $\mu$m thickness, has been deposited on the glassy carbon panels 4, the silicon components are removed from the gas flow and cooling gas only, i.e., for example, hydrogen or an inert gas, is introduced into the reactor. At the same time, the electric current is so reduced that the substrate panels have only a temperature of about the melting point of silicon. The flow of cooling gas is introduced, preferably in an amount increasing per unit of time, until the surface of the silicon layer begins to crystalize. The electric current in the glassy carbon panels is now reduced still further, while cooling gas continues to be passed through the reactor 3. After several minutes, the electric current is finally switched off completely, the reactor is rinsed with argon, and the silicon-coated glassy carbon panels are removed.

When the contact points have been sawn off, the coated glassy carbon panels lying back to back are separated from one another with the use of a spatula. For use as solar cells, the silicon layers are superficially oppositely doped by known means and then contacted.

The process of the invention will now be more fully described in a specific example but it should be understood that this is given by way of illustration only, and not by way of limitation.

EXAMPLE

Eighteen glassy carbon panels 1000 mm long, 200 mm wide and 3 mm thick are installed in pairs in a reactor of the type described above. Air is then removed from the reactor by rinsing with argon and the glassy carbon panels are heated by the direct passage of an electric current to 1,460° C. A deposition gas is then introduced into the reactor at rates of 23 normal cubic meters of hydrogen per hour mixed with 4.5 normal cubic meters of trichlorosilane per hour, and also with about 13 mg of boron tribromide per hour.

After about 60 minutes, the supply of trichlorosilane and dopant is ceased and hydrogen only is introduced as cooling gas at the rate of 5 normal cubic meters per hour. At the same time, the temperature of the glassy carbon panels is reduced to about 1,430° C.

The flow of cooling gas is now increased until the free surface of the silicon layer begins to crystallize. Further increase in the flow of cooling gas to 25 normal cubic meters of hydrogen per hour finally leads to the oriented solidification of the entire silicon layer.

After about 10 minutes the electric current is switched off altogether, the reactor is rinsed with argon and the coated glassy carbon panels are removed. The caked edge region at the point where the glassy carbon panels have touched the carbon mounting are sawed off, and the glassy carbon panels are separated from one another with a spatula.

18 panels having dimensions of 900 × 200 × 3.1 mm are obtained. On one side the panels have a uniform silicon layer 100 μm thick having a specific resistance of 3.2 Ωcm and a p-type conductance.

After development of a pn-transition by superficial opposite-doping with phosphorus, the solar cells produced from the panels have an efficiency of between 6 and 10%.

While only a few embodiments of the present invention have shown and described, it will be obvious to those skilled in the art that many changes and modifications may be made thereunto without departing from the spirit and scope of the invention.

What is claimed is:

1. A process for the manufacture of silicon of large surface area bonded to a substrate by deposition from the gaseous phase onto panel-shaped substrates, wherein the silicon deposited is converted from its molten state into crystalline form under the influence of a temperature gradient at a right angle to the surface of the substrate, which comprises depositing silicon from decomposition of silicon-containing vapors to a thickness of from 30 to 500 μm onto panel-shaped substrates of glassy carbon that are heated by direct passage of an electric current to a temperature of from 1430° to 1500°C. and thereafter cooling the silicon to a temperature below its melting point in the direction from its free surface towards the substrate.

2. The process according to claim 1 wherein trichlorosilane in admixture with hydrogen is used as deposition gas.

3. The process according to claim 2, wherein the deposition gas contains a dopant.

4. The process according to claim 3, wherein the deposition gas contains boron.

5. Process according to claim 3 wherein, starting from the free surface of the silicon layer, dopants are incorporated up to a depth of from 0.5 to 3 μm, which dopants dope silicon oppositely to the dopants of the adjoining silicon layer, in order to produce a p, n-transition.

* * * * *